(12) United States Patent
Blümel et al.

(10) Patent No.: US 8,525,206 B2
(45) Date of Patent: *Sep. 3, 2013

(54) ILLUMINATION DEVICE

(75) Inventors: Simon Blümel, Schierling (DE); Franz Schellhorn, Regensburg (DE); Günter Waitl, Regensburg (DE); Mario Wanninger, Harting (DE)

(73) Assignee: Osram Opto Semiconductor GmbH, Regensburg (DE)

( * ) Notice: Subject to any disclaimer, the term of this patent is extended or adjusted under 35 U.S.C. 154(b) by 244 days.

This patent is subject to a terminal disclaimer.

(21) Appl. No.: 12/971,543

(22) Filed: Dec. 17, 2010

(65) Prior Publication Data

US 2011/0085336 A1 Apr. 14, 2011

Related U.S. Application Data

(63) Continuation of application No. 11/814,595, filed on Dec. 3, 2007, now Pat. No. 7,880,188.

(30) Foreign Application Priority Data

Feb. 28, 2005 (DE) .......................... 10 2005 009 067
May 4, 2005 (DE) .......................... 10 2005 020 908

(51) Int. Cl.
*H01L 33/00* (2010.01)

(52) U.S. Cl.
USPC ............... 257/98; 257/E33.001; 257/E33.061

(58) Field of Classification Search
USPC ........ 257/79–87, 95–100, E33.055, E33.056, 257/E33.057, E33.058, E33.059, E33.001, 257/E33.061
See application file for complete search history.

(56) References Cited

U.S. PATENT DOCUMENTS

| 4,176,271 A | 11/1979 | Terai et al. |
| 4,734,836 A | 3/1988 | Negishi |
| 4,907,044 A | 3/1990 | Schellhorn et al. |
| 5,040,868 A | 8/1991 | Waitl et al. |
| 5,684,309 A | 11/1997 | McIntosh et al. |

(Continued)

FOREIGN PATENT DOCUMENTS

| CN | 1355569 | 6/2002 |
| CN | 1536686 | 10/2004 |

(Continued)

OTHER PUBLICATIONS

"Translation of the Notification of Reasons for Refusal (type I office action)", Japanese Patent Appl. No. 2007-557319, issued on Jul. 22, 2011 (5 pages).

(Continued)

*Primary Examiner* — Brook Kebede
(74) *Attorney, Agent, or Firm* — Fish & Richardson P.C.

(57) ABSTRACT

An illumination device is specified which comprises an optoelectronic component having a housing body and at least one semiconductor chip provided for generating radiation, and a separate optical element, which is provided for fixing at the optoelectronic component and has an optical axis, the optical element having a radiation exit area and the radiation exit area having a concavely curved partial region and a convexly curved partial region, which at least partly surrounds the concavely curved partial region at a distance from the optical axis, the optical axis running through the concavely curved partial region.

14 Claims, 8 Drawing Sheets

(56) References Cited

U.S. PATENT DOCUMENTS

| | | | |
|---|---|---|---|
| 6,917,057 B2 * | 7/2005 | Stokes et al. | 257/98 |
| 6,924,514 B2 * | 8/2005 | Suenaga | 257/98 |
| 6,957,901 B2 | 10/2005 | Schach et al. | |
| 7,517,728 B2 * | 4/2009 | Leung et al. | 438/122 |
| 7,880,188 B2 * | 2/2011 | Blumel et al. | 257/98 |
| 2001/0000410 A1 | 4/2001 | Krames et al. | |
| 2002/0080597 A1 | 6/2002 | Coghlan | |
| 2002/0181222 A1 | 12/2002 | Boyd et al. | |
| 2003/0235050 A1 | 12/2003 | West et al. | |
| 2004/0075100 A1 | 4/2004 | Bogner et al. | |
| 2004/0124487 A1 | 7/2004 | Loh | |
| 2004/0201025 A1 | 10/2004 | Barnett et al. | |
| 2004/0245528 A1 | 12/2004 | Hiramoto | |
| 2004/0264185 A1 | 12/2004 | Grotsch et al. | |
| 2005/0040424 A1 | 2/2005 | Erchak et al. | |
| 2006/0091409 A1 | 5/2006 | Epler et al. | |
| 2006/0119250 A1 | 6/2006 | Suehiro et al. | |
| 2006/0186429 A1 | 8/2006 | Chew | |

FOREIGN PATENT DOCUMENTS

| | | |
|---|---|---|
| DE | 10021114 | 11/2001 |
| DE | 10319274 | 12/2004 |
| EP | 1 098 088 | 10/1986 |
| EP | 1 022 787 | 7/2000 |
| EP | 1213773 | 6/2002 |
| EP | 1227458 | 7/2002 |
| EP | 1 376 708 | 1/2004 |
| EP | 1 453 107 | 9/2004 |
| EP | 1 484 802 | 12/2004 |
| EP | 1 641 052 | 3/2006 |
| JP | 61-063712 | 4/1986 |
| JP | 63-081995 | 4/1988 |
| JP | 1-165182 | 6/1989 |
| JP | 3-11771 | 1/1991 |
| JP | 2002-344027 | 11/2002 |
| JP | 2003-035883 | 2/2003 |
| JP | 2003-158302 | 5/2003 |
| JP | 2003-218408 | 7/2003 |
| JP | 2004-172579 | 6/2004 |
| JP | 2004-529382 | 9/2004 |
| JP | 2004-363454 | 12/2004 |
| JP | 2005-19424 | 1/2005 |
| JP | 2006-92983 | 4/2006 |
| KR | 10-2004-0067283 | 7/2004 |
| WO | 02/081929 | 10/2002 |
| WO | WO 02/084749 | 10/2002 |
| WO | WO 2004/102685 | 11/2004 |

OTHER PUBLICATIONS

Japan Patent Office, "Translation of the Decision of Refusal", JP Pat. Appl. No. 2007-557319, issued on Jun. 27, 2012 (4 pages).

Schnitzer, I. et al., "30% External Quantum Efficiency from Surface Textured, Thin-film Light-emitting Diodes", *Appl. Phys. Lett.*, vol. 63, No. 16, pp. 2174-2176, 1993.

* cited by examiner

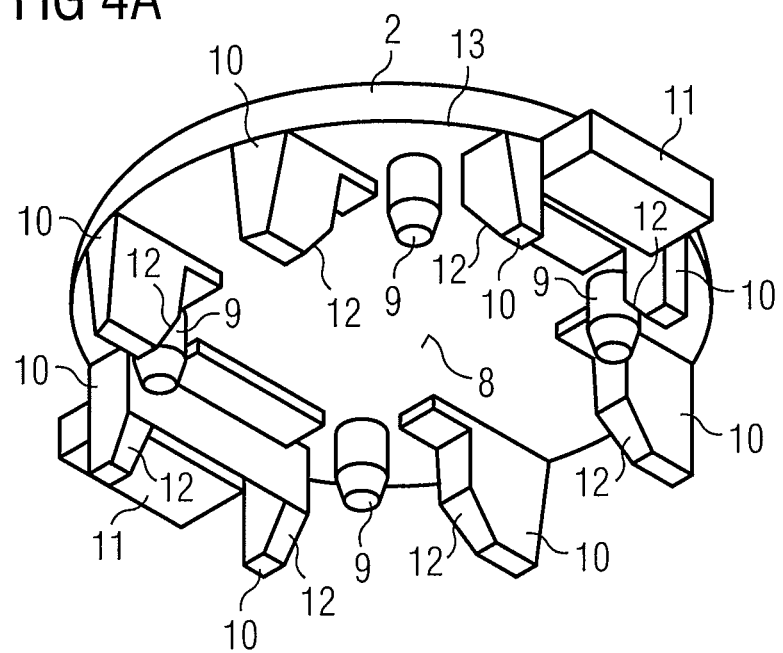
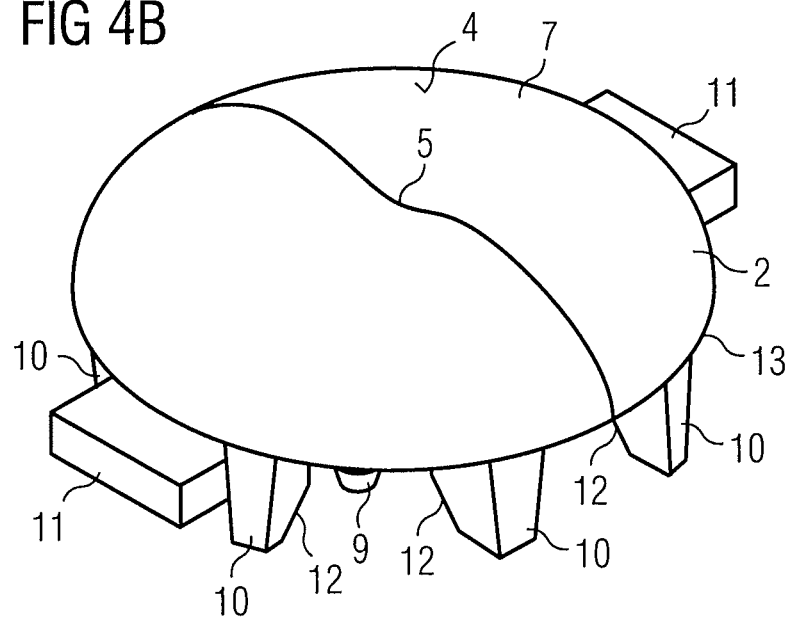

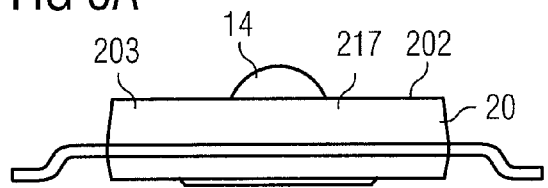
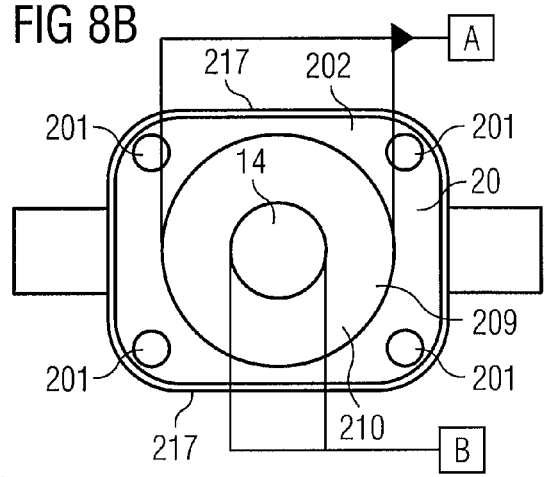
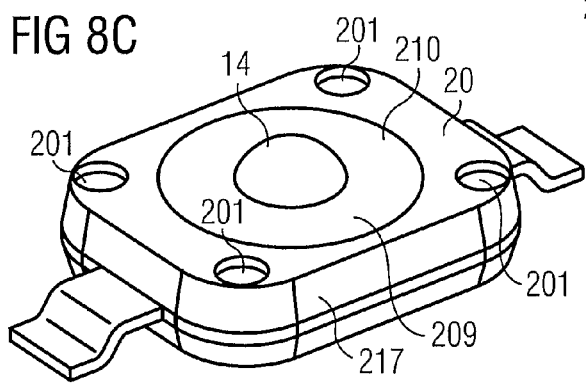
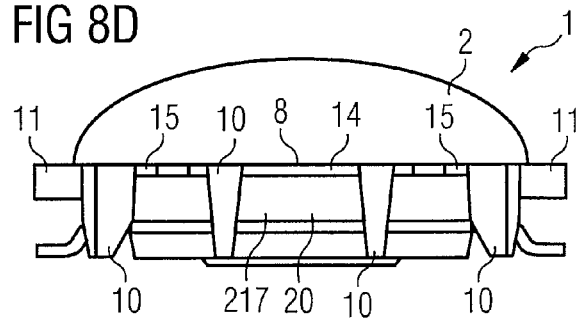

US 8,525,206 B2

ILLUMINATION DEVICE

CROSS-REFERENCE TO RELATED APPLICATIONS

This application is a continuation application (and claims the benefit of priority under 35 U.S.C. §120) of U.S. patent application Ser. No. 11/814,595, filed Dec. 3, 2007, which is the National Stage of International Application No. PCT/DE2006/000314, filed Feb. 21, 2006, which claims the benefit of priority to German Patent Application Ser. Nos. 102005009067.2, filed Feb. 28, 2005 and 102005020908.4, filed May 4, 2005. The contents of the prior applications are hereby incorporated by reference in their entireties.

FIELD OF THE INVENTION

The invention relates to an illumination device having a semiconductor chip provided for generating radiation.

BACKGROUND

Illumination devices of this type are often used for illuminating planar areas. Conventional semiconductor chips often have a comparatively narrow-angled emission characteristic, so that a large part of the radiation generated by the semiconductor chip is emitted into a comparatively narrow solid angle range. A large-area illumination with a semiconductor chip of this type is made more difficult on account of the narrow-angled emission characteristic of the semiconductor chip. An optical element can be used to widen the emission characteristic.

An optical element of this type is described in U.S. Pat. No. 4,907,044, for example. The semiconductor chip is in each case surrounded by the optical element by moulding. FIG. 4 of U.S. Pat. No. 4,907,044 shows a radial LED with an optical element of this type, while FIG. 8 shows a so-called overmould LED design with the optical element. In both designs, firstly the semiconductor chip is contact-connected on the connections and subsequently surrounded by the optical element, the overmould design, in contrast to the radial design, being suitable for surface mounting. On account of the semiconductor chip being encapsulated on all sides by the optical element, there is an increased risk of damage to the optical element in the case of these designs with high radiation power, for instance on account of the heat loss arising during the generation of radiation. Accordingly, the components shown in U.S. Pat. No. 4,907,044 are of only limited suitability for high-power applications for generating high radiation powers with a correspondingly high lost heat.

SUMMARY

It is an object of the present invention to specify an improved illumination device.

In a first embodiment, an illumination device according to the invention comprises an optoelectronic component having a housing body and at least one semiconductor chip provided for generating radiation, and a separate optical element, which is intended for fixing at the optoelectronic component and has an optical axis, the optical element having a radiation exit area and the radiation exit area having a concavely curved partial region and a convexly curved partial region, which at least partly surrounds the concavely curved partial region at a distance from the optical axis, the optical axis running through the concavely curved partial region.

The optoelectric component can advantageously be formed essentially independently of the separate optical element. As a consequence, the optoelectronic component can be optimized in a simplified manner toward high-power applications for generating a high radiation power without increasing the risk of damage to the optical element on account of the high lost heat.

In one preferred refinement, the semiconductor chip is embodied as a thin-film semiconductor chip. In the context of the application, a thin-film semiconductor chip is regarded as a semiconductor chip during whose production the growth substrate onto which a semiconductor layer sequence which a semiconductor body of the thin-film semiconductor chip comprises has been grown, for example epitaxially, is thinned or, in particular completely, stripped away. The semiconductor body is preferably arranged on a carrier which mechanically stabilizes the semiconductor body said carrier being particularly preferably different from the growth substrate for the semiconductor layer sequence of the semiconductor body.

The carrier of the thin-film semiconductor chip is advantageously not subject to the comparatively high requirements that have to be fulfilled by a growth substrate, for instance with regard to the crystal structure. The degrees of freedom in the selection of the carrier are advantageously increased compared with the degrees of freedom in the selection of the growth substrate. By way of example, the carrier may be chosen comparatively freely with regard to thermal properties, such as a coefficient of thermal expansion adapted to the semiconductor body or a high thermal conductivity. A high thermal conductivity is of particular significance in high-power applications in which a critical quantity of heat is generated in the semiconductor chip during operation of the semiconductor chip. If the quantity of heat generated in the semiconductor chip is not dissipated sufficiently from the semiconductor chip, then the risk of damage to the semiconductor chip is increased. This risk can advantageously be reduced by the use of a carrier having a high thermal conductivity which is different from the growth substrate.

In a further embodiment, an illumination device according to the invention comprises a semiconductor chip provided for generating radiation, and an optical element having an optical axis, the semiconductor chip being embodied as a thin-film semiconductor chip, the optical element having a radiation exit area and the radiation exit area having a concavely curved partial region and a convexly curved partial region, which at least partly surrounds the concavely curved partial region at a distance from the optical axis, the optical axis running through the concavely curved partial region.

Such shaping of the radiation exit area of the optical element facilitates the variation of the emission characteristic of the illumination device, so that the radiation power coupled out from the illumination device at an angle with respect to the optical axis is increased compared with the emission characteristic of the component without an optical element. In particular the convexly curved partial region contributes to this, this partial region increasing the proportion of radiation coupled out from the illumination device at large angles with respect to the optical axis. The illumination device having such an optical element is accordingly particularly suitable for the homogeneous illumination of a comparatively large, in particular planar, area including area regions that are offset laterally with respect to the optical axis. The illumination device is preferably provided for the backlighting of a display device, for instance an LCD (liquid crystal display).

In one preferred refinement, the illumination device comprises an optoelectronic component having a housing body and the semiconductor chip, the optical element being embodied as a separate optical element and the optical element being provided for fixing at the optoelectronic component.

In a further preferred refinement, the optical axis, in particular of the optical element fixed at the optoelectronic component, runs through the semiconductor chip. The semiconductor chip may be arranged in particular in centred fashion with regard to the optical axis. Such an arrangement of the semiconductor chip facilitates homogeneous beam shaping of the radiation generated by the semiconductor chip by means of the optical element.

In a further preferred refinement, the optical element is embodied in rotationally symmetrical fashion with respect to the optical axis. This advantageously results in an emission characteristic of the illumination device which is uniform and homogeneous azimuthally with respect to the optical axis.

In a further preferred refinement, the convexly curved partial region has a curvature which is less than a curvature of the concavely curved partial region. The homogeneous illumination of area regions to be illuminated by means of the illumination device at a comparatively large distance from the optical axis is facilitated.

Furthermore, the surface area of the convexly curved partial region of the radiation exit area may be greater than the surface area of the concavely curved partial region. Radiation emerging from the optical element in the region of the concavely curved partial region homogeneously illuminates a region of the area to be illuminated which crosses the optical axis, while the radiation emerging from the convexly curved partial region is embodied for the homogeneous illumination of regions at a distance from the optical axis. Since area regions at a distance from the optical axis are often larger than the regions surrounding the optical axis, the homogeneous illumination of the area regions at a distance from the optical axis is facilitated by means of an enlarged area content of the convexly curved partial region compared with the area content of the concavely curved partial region. A transition region between the convexly curved partial region and the concavely curved partial region is preferably embodied in such a way that the convexly curved partial region and the concavely curved partial region have, in particular exclusively, common tangents in the transition region. Inhomogeneities in the local radiation power or intensity distribution on the area to be illuminated can thus be reduced or avoided. The radiation exit area of the optical element may be embodied in a manner free of edges and/or overall as a differentiable surface.

Furthermore, in the case of the invention, the optical element may be formed in such a way that two, in particular arbitrary, beams emerging from the optical element on the part of the radiation exit area proceed without any intersections, that is to say that said beams do not intersect or cross one another. The formation of regions on the illuminated area which are illuminated with an increased radiation power compared with adjacent regions can thus be avoided. In particular, the local distribution of the radiation power on the area to be illuminated may be independent of the distance between the area and the illumination device.

Furthermore, the optical element may be embodied in such a way that the beam shaping by or the beam guidance in the optical element is effected in a manner free of total reflection. The production tolerances for the optical element are thus increased.

In a further preferred refinement, the convexly curved partial region is embodied in accordance with a convex lens and the concavely curved partial region is embodied in accordance with a concave lens.

In a further preferred refinement, the convexly curved partial region has a first region and a second region, the curvature of the first region being less than the curvature of the second region. The second region is preferably further away from the optical axis or from the concavely curved partial region than the first region. This advantageously makes it possible to increase the radiation power or the proportion of radiation emerging from the optical element at a comparatively large angle with respect to the optical axis via the more greatly curved second region.

In a further preferred refinement, the curvature of the convexly curved partial region, in particular the curvature of the second region, increases with increasing distance from the concavely curved partial region. The curvature may increase continuously, in particular.

An increase in the curvature of the convexly curved partial region with increasing distance from the concavely curved partial region makes it possible to increase the angle with respect to the optical axis at which radiation is coupled out from the convexly curved partial region. A homogeneous illumination of partial areas of the area to be illuminated which are at a comparatively large distance from the optical axis is thus facilitated.

In a further preferred refinement, the housing body is prefabricated and the semiconductor chip, after the prefabrication of the housing body, is subsequently arranged at or in the housing body. The housing body is prefabricated in particular before the semiconductor chip is arranged in the housing body. Compared with the semiconductor chip being formed around with a radiation-transmissive optical element, such as, for instance, in the case of the radial LEDs or overmould designs mentioned in the introduction, the risk of damage to the semiconductor chip or the contact-connection of the semiconductor chip, such as a sensitive bonding wire, is advantageously reduced when the housing body is prefabricated.

In a further preferred refinement, the optoelectronic component has a leadframe which is formed around, in particular a leadframe around which the housing body is formed, for example by moulding or casting. The leadframe may be surrounded by the housing body by moulding for example by means of injection moulding, transfer moulding or compression moulding. The housing body may contain a plastic. The optoelectronic component may accordingly have a prefabricated housing comprising the housing body and the leadframe. In particular, the housing may be embodied as a so-called premoulded housing design. In the case of a design of this type, the semiconductor chip is mounted onto the leadframe after the production of the housing.

In a further preferred refinement, the optoelectronic component, in particular the leadframe, has a first electrical connection part, a second electrical connection part and a thermal connection part, which in particular is formed separately from the electrical connection parts. Electrical contact can be made with the semiconductor chip via the electrical connection parts. The thermal connection part enables a good thermal linking to an external heat conducting device, for instance a heat sink, independently of the electrical contact-connection of the optoelectronic component by means of the electrical connection parts. The electrical connection parts may be electrically conductively connected, in particular soldered to conductor tracks of a circuit board, for example. The thermal connection part may be thermally conductively connected, for instance by means of soldering to the external heat conducting device, for example, the external heat conducting device being preferably electrically insulated from the conductor tracks.

In one advantageous development, the electrical connection parts and the thermal connection part are in each case at least partly part of an enveloping area that completely envelopes the surface of the housing body on the part of different side areas of the surface of the housing body. In particular, the electrical connection parts and the thermal connection part may emerge from the housing body on the part of different side areas or form a part of the surface of the housing body at different side areas. Preferably, the electrical connection parts on the part of in each case different side areas of the surface of the housing body in each case also form at least partly a part of an enveloping area that completely envelopes the surface of the housing body. A separate electrical and thermal connectability by means of the electrical connection part and the thermal connection part, respectively, is thus facilitated.

In a further preferred refinement, the optoelectronic component is embodied as a surface-mountable component (SMD: Surface Mountable Device). Surface-mountable components are distinguished by particularly simple manageability, particularly during mounting on a circuit board. They may for example be positioned on a circuit board by means of a simple "pick and place" process and subsequently be electrically and/or thermally connected. Furthermore, the illumination device with the optical element mounted at the optoelectronic component may be embodied in surface-mountable fashion. During the mounting of the device, the risk of damage to the optical element, for instance on account of the high soldering temperature, is advantageously not critically increased.

In a further preferred refinement, a mirror layer is arranged on the semiconductor body, in particular between the semiconductor body and the carrier. Radiation generated in the semiconductor body can be reflected from the mirror layer, as a result of which the radiation power emerging from the semiconductor body on the opposite side to the mirror layer can advantageously be increased. Furthermore, the mirror layer prevents absorption of radiation in structures, such as an absorbent carrier, for instance, arranged on the opposite side of the mirror layer to the semiconductor body. The degrees of freedom in the selection of the carrier are thus increased more extensively.

Preferably, the mirror layer contains a metal or the mirror layer is essentially embodied in metallic fashion. By way of example, the mirror layer contains Au, Al, Ag, Pt, Ti or an alloy with at least one of these materials. Au, for example, is distinguished by a high reflectivity in the red spectral range, while Ag or Al also exhibits a high reflectivity in the blue or ultraviolet spectral range.

In a further preferred refinement, the optical element has at least one fixing element provided for fixing the optical element at the optoelectronic component. The fixing element may be fitted, for instance adhesively bonded, to a prefabricated optical element. Furthermore, the fixing element may be formed jointly with the optical element during the production of the optical element. In the latter case, the optical element and the fixing element may be embodied in one piece. The optical element may be casted or moulded, for example. By way of example, in particular an injection moulding, transfer moulding or compression moulding method is suitable for this purpose.

In this respect, it should be noted that the configuration of the optical element that is preferably rotationally symmetrical with respect to the optical axis which is mentioned further above essentially relates to the optical functional areas, that is to say those elements of the optical element which are provided for beam shaping or beam guidance. Elements which principally do not serve for beam shaping, such as the fixing element, need not necessarily be embodied in rotationally symmetrical fashion with respect to the optical axis.

Preferably, the optical element is formed such that it can be plugged onto the optoelectronic component. A pin-like fixing element is particularly suitable for this.

The optical element preferably contains a reaction resin, for instance an epoxy resin or an acrylic resin, a silicone resin or a silicone. The optical element may furthermore contain a thermoplastic material. Furthermore, the optical element is preferably embodied as a rigid body which is plastically deformable in particular only with additional measures, such as, for instance, heating or considerable expenditure of force.

In a further preferred refinement, the fixing element is arranged on the part of a radiation entrance area of the optical element.

In a further preferred refinement, the optoelectronic component, in particular the housing body, has at least one fixing device. The optical element can be fixed at the optoelectronic component by means of the interaction of the fixing element with the fixing device. For this purpose, the fixing device is expediently formed as a counterpart to the fixing element. The fixing element for fixing the optical element at the optoelectronic component preferably engages into the fixing device.

In a further preferred refinement of the invention, the optical element is provided for fixing by means of press fit, hot press fit, caulking, hot caulking, thermal riveting or adhesive bonding at the optoelectronic component.

In the case of a press fit, the optical element is fixed at the component by means of the pressure exerted by the fixing element of the optical element and the fixing device of the optoelectronic component on one another. Said pressure preferably acts essentially along the normal to the surface of the fixing element and of the fixing device, respectively.

In the case of the hot press fit, the fixing element is heated in such a way that although it is not flowable, and in particular is dimensionally stable without additional force action, it is nevertheless plastically shapeable. The heated fixing element shapes itself to the fixing device under the action of force. After the fixing element has cooled down, the optical element is fixed mechanically stably at the optoelectronic component.

In the case of caulking, the fixing element and/or the fixing device experiences a mechanically produced deformation, if appropriate in addition to a press-fitting pressure. For this purpose, the fixing element and/or the fixing device is deformed for example by means of a deformation tool, for instance a needle, in such a way that the optical element is fixed mechanically stably at the optoelectronic component. The deformation may be effected in particular punctiform or in regions. In the case of hot caulking, the deformation tool is additionally heated, so that the fixing element becomes plastically shapeable and/or flowable in the region of contact with the tool. The expenditure of force can be reduced in the case of hot caulking compared with caulking.

In the case of adhesive bonding, the fixing is effected by means of an adhesive bond which is formed, for instance by means of an adhesion promoting material, between the fixing element and the fixing device.

In the case of thermal riveting, the fixing element is heated, preferably in a partial region, in such a way that it becomes flowable and flows onto the optoelectronic component, in particular the housing body and/or the fixing element of the housing body, and cures as it cools down, a mechanically stable fixing being formed thereafter.

In a further preferred refinement, the optical element has at least one guide element. The guide element may facilitate the mounting of the optical element at the optoelectronic component. The guide element is preferably embodied in such a way that the fixing element is guided to the fixing device by means of the guide element in the case of a slightly misaligned arrangement with regard to the fixing device. Such guidance may preferably be obtained by means of the inherent weight of the optical element or a pressure exerted by means of a mounting tool. The optical element may "slip" onto the optoelectronic component in particular with guidance by the guide element, the guide element preferably being formed in such a way that the fixing element engages into the fixing device or "slips" into the fixing device. Furthermore, the guide element is preferably in direct, in particular mechanical, contact with the housing body when guiding the fixing element to the fixing device and/or after the mounting of the optical element has been concluded.

Preferably, the guide element, compared with the fixing element, is arranged closer to an edge delimiting the optical element on the part of the fixing element. After the fixing of the optical element at the optoelectronic component, preferably at least part of the housing body is arranged between the guide element and the fixing element.

In particular, the guide element may be arranged outside the housing body and may extend for example in the vertical direction along a side area of the housing body. The guide element is preferably in direct contact with the side area.

In a further preferred refinement, the guide element is embodied in bevelled fashion or in chamfered fashion in particular on a side remote from the edge that delimits the optical element on the part of the fixing element. Such bevelling or chamfering makes it possible to facilitate the "slipping" of the optical element onto the housing body of the optoelectronic component or the "slipping" of the fixing element into the fixing device.

In a further preferred refinement, the optical element has a plurality of fixing elements and/or guide elements. The mechanical stability of the fixing and the positional stability of the mounted optical element relative to the semiconductor chip can thus be increased on account of a plurality of fixing elements. A plurality of fixing elements facilitates the fixing of the optical element at the optoelectronic component. Furthermore, the guide elements may also contribute to the mechanical stability or to the positional stability of the optical element. In particular, the risk of damage to the optical element, for instance on account of shear forces acting on the illumination device, can be reduced by means of the guide elements.

In a further preferred refinement, an intermediate layer is arranged between the optical element fixed at the optoelectronic component and the semiconductor chip.

In a further preferred refinement, the intermediate layer is plastically shapeable. A plastically shapeable material for the intermediate layer can be provided on the optoelectronic component prior to the mounting of the optical element at the optoelectronic component. During the mounting of the optical element at the optoelectronic component, a pressure can be exerted on the shapeable material by means of the optical element in such a way that the material is distributed in the lateral direction during the fixing of the optical element and the intermediate layer is formed. The intermediate layer may, in particular directly, adjoin the optical element, for instance on the part of the radiation entrance side. Furthermore, the material for the intermediate layer is preferably dimensionally stable without the action of force. An uncontrolled deliquescence of the material before the action of force is thus avoided.

In a further preferred refinement, an interspace is formed between the optical element fixed at the optoelectronic component and the optoelectronic component, in particular between that side of the housing body which faces the optical element and the radiation entrance area.

In a further preferred refinement, the intermediate layer contains a silicone, in particular a silicone gel. A silicone is particularly suitable as material for the intermediate layer.

Preferably, the interspace is provided as a gap or joint for receiving the intermediate layer in the event of an expansion of the intermediate layer. If the intermediate layer expands, for example on account of heating, then the intermediate layer can expand into the joint without significantly increasing the mechanical loading on the optical element or the optoelectronic component. In the course of cooling down, the optical element can withdraw from the joint. The interspace is preferably formed between the optical element and that region of the housing body which has the smallest distance from the optical element.

In particular, the radiation entrance area may be spaced apart from the housing body over its whole area. This may be achieved by forming the fixing element in a suitable manner.

In a further preferred refinement, the semiconductor chip is embedded in an encapsulation, which, in particular, is transmissive to the radiation generated by the semiconductor chip. The encapsulation may contain for example reaction resin, such as an acrylic or epoxy resin, a silicone resin or a silicone. The encapsulation is preferably formed in rigid fashion, in particular compared with the intermediate layer, in order not to increase the risk of damage to the chip or the chip contact-connection, which may be effected for example by means of a bonding wire which is preferably likewise embedded in the encapsulation.

In a further preferred refinement, the intermediate layer is formed as a refractive index adaptation layer. Excessive jumps in refractive index, which would lead to correspondingly high reflection losses of radiation generated by the semiconductor chip at the respective interfaces, can thus be avoided. The intermediate layer particularly preferably reduces jumps in refractive index which the radiation generated by the semiconductor chip experiences between the exit from the encapsulation and the entrance into the optical element. The intermediate layer particularly preferably reduces the jump in refractive index compared with an air-filled free space instead of the intermediate layer. The intermediate layer advantageously improves the optical linking of the optical element to the optoelectronic component.

The intermediate layer may furthermore be embodied in adhesion-promoting fashion, thereby advantageously improving the mechanical linking of the optical element to the optoelectronic component.

In a further preferred refinement, the intermediate layer adjoins the encapsulation and the optical element. The intermediate layer preferably covers that region of the optical element in which radiation generated by the semiconductor chip couples into the optical element.

The encapsulation is preferably covered, in particular completely, with the intermediate layer in the radiation exit region of the encapsulation.

Further features, advantageous refinements and expediences of the invention emerge from the following description of the exemplary embodiments in conjunction with the figures.

DESCRIPTION OF DRAWINGS

FIG. 8 shows, in FIGS. 8A to 8D, different schematic views of an optoelectronic component in accordance with FIG. 7 and of a third exemplary embodiment of an illumination device according to the invention.

Elements that are identical, of identical type and act identically are provided with identical reference symbols in the figures.

DETAILED DESCRIPTION

Figure 1:
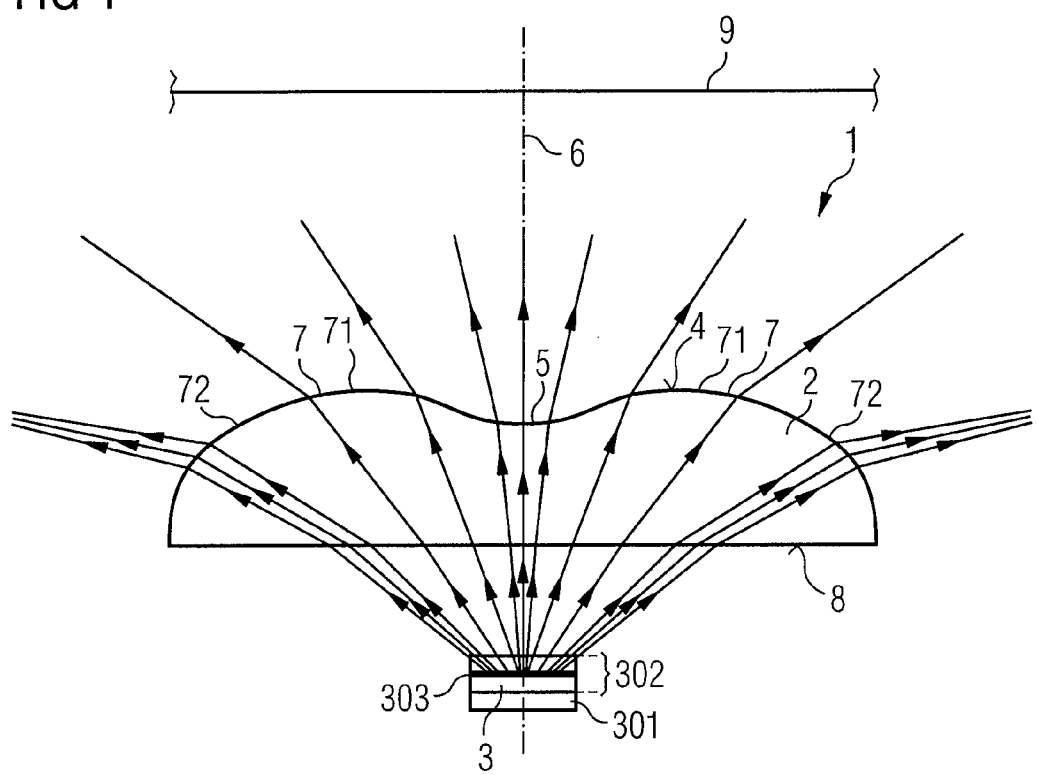
FIG. 1 shows a schematic sectional view of a first exemplary embodiment of an illumination device according to the invention.

FIG. 1 shows a schematic sectional view of a first exemplary embodiment of an illumination device.

The illumination device 1 comprises an optical element 2 and a semiconductor chip 3 provided for generating radiation. A radiation exit area 4 of the optical element 2 has a concavely curved partial region 5, through which the optical axis 6 of the optical element runs, and a convexly curved partial region 7 surrounding the concavely curved partial region at a distance from the optical axis. The convex partial region and the concave partial region may be embodied in particular in accordance with a convex or concave lens.

Radiation emitted in an active zone 303 of the semiconductor chip 3 arranged on the optical axis 6 enters into the optical element 2 via a radiation entrance area 8, which is preferably embodied in planar fashion. The radiation, in particular visible radiation, generated by the semiconductor chip is illustrated in FIG. 1 by the lines which are identified with arrows and symbolize individual light rays.

The optical element 2 is formed for the homogeneous illumination of an area 9, for instance of a diffuser film or for a display device, such as an LCD. The optical axis preferably runs through the area 9. The area 9 particularly preferably runs essentially perpendicular to the optical axis 6.

The optical element is formed for the homogeneous illumination of the area 9. Through suitable formation of the curvatures of the convexly curved partial region and of the concavely curved partial region, the radiation generated by the semiconductor chip can be distributed on the radiation exit side in such a way that the area 9 is illuminated uniformly and homogeneously by means of the illumination device. Preferably in each case essentially the same radiation power impinges on different, equally sized regions of the area.

Radiation emerging via the concave partial region 5 is spread in a manner similar to that in the case of a diverging lens. In particular, radiation impinging on the radiation exit area at an angle that differs from 90° with respect to the optical axis is refracted away from the optical axis upon entering into the optical element. The radiation emerging from the concave partial region serves for homogeneously illuminating a region of the area 9 that surrounds the optical axis 6.

For the illumination device to have an emission characteristic which is uniform azimuthally peripherally around the optical axis 6, the optical element is preferably embodied in rotationally symmetrical fashion with respect to the optical axis 6.

Regions of the area 9 which are spaced apart comparatively far from the optical axis are illuminated by means of radiation that emerges from the optical element 2 via the convexly curved partial region 7 at an angle that differs from 90° with respect to the optical axis 6. The transition region between the concave partial region and the convex partial region is preferably smooth, in particular is formed in a manner free of edges. In particular, the radiation exit area may be embodied in differentiable fashion, preferably over the whole area. A homogeneous illumination of the area 9 is thus facilitated.

The convexly curved partial region of the radiation exit area preferably has a larger area content than the concavely curved partial region. As a consequence, compared with the concavely curved partial region, an increased proportion of radiation emerges from the optical element via the convexly curved partial region.

Furthermore, the convexly curved partial region preferably has a first region 71 having a first curvature and a second region 72 having a second curvature. In this case, the first curvature is preferably less than the second curvature.

On account of the greater curvature in the second region 72, radiation emerging from the optical element 2 in the second region is advantageously at a greater angle with respect to the optical axis 6 than radiation emerging from the optical element in the first region 71 or in the concave partial region 5. The homogeneous illumination of regions of the area 9 that are comparatively far away from the optical axis is thus facilitated.

Preferably, radiation from the optical element emerges from the optical element only at an angle of less than 90° with respect to the optical axis. The illumination device radiates in particular laterally or transversely with respect to the optical axis and forward, in the direction of the optical axis. The illumination device 1 is preferably embodied in such a way that a large part of the radiation power emerges from the optical element at an angle with respect to the optical axis, in particular via the convexly curved partial region.

The curvature of the convex partial region may increase with increasing distance from the concavely curved partial region, in particular in the second region 72 in the direction of the radiation entrance area 8, thereby facilitating an increased coupling-out of radiation at large angles with respect to the optical axis and thus the illumination of regions of the area 9 that are comparatively far away from the optical axis.

The illumination device 1 may be embodied in such a way that beams emerging from the optical element do not overlap, so that the local radiation power distribution on the area to be illuminated is essentially independent of the distance between the area and the illumination device.

If the optical element brought about a crossover of beams in the case of beam shaping, then a focal region could be formed, so that the local radiation power distribution on the area would be dependent on the distance between the area and the optical element. Upon variation of the distance between the area 9 and the optical element 2 inhomogeneities, for instance rings of higher intensity, in the local radiation power distribution would be formed. Said inhomogeneities are brought about by a crossover of beams. In the case of the optical element shown in FIG. 1, however, on account of the radiation running in a manner free of intersections, the local distribution of the radiation power on the area 9 is independent of the distance between the area and the optical element 2. Furthermore, the beam shaping or the beam guidance in the optical element is preferably effected in a manner free of total reflection.

The optical element is preferably formed as a separate optical element intended for fixing at an optoelectronic component comprises the semiconductor chip. The optoelectronic component can thus be optimized independently of the optical element for a high-power application and subsequently be provided with the separate optical element. The individual components of the illumination device can therefore be produced in a manner optimized independently of one another for their respective main function, beam shaping in the case of the optical element and generation of radiation in the case of the component.

The semiconductor chip 3 is furthermore preferably embodied as a thin-film semiconductor chip. A semiconductor body 302 of the semiconductor chip 3, which comprises a semiconductor layer sequence with the active zone 303, is arranged on a carrier 301, which is different from a growth substrate on which the semiconductor body, in particular the semiconductor layer sequence, was grown, preferably epitaxially. Accordingly, the carrier 301 does not have to meet the high requirements for a growth substrate, but rather may be embodied in a manner optimized for example with regard to the heat dissipation properties. A thin-film semiconductor chip in the case of which the growth substrate is stripped away during production is accordingly particularly suitable for high-power applications with a comparatively high heat loss arising in the semiconductor chip.

Figure 2:
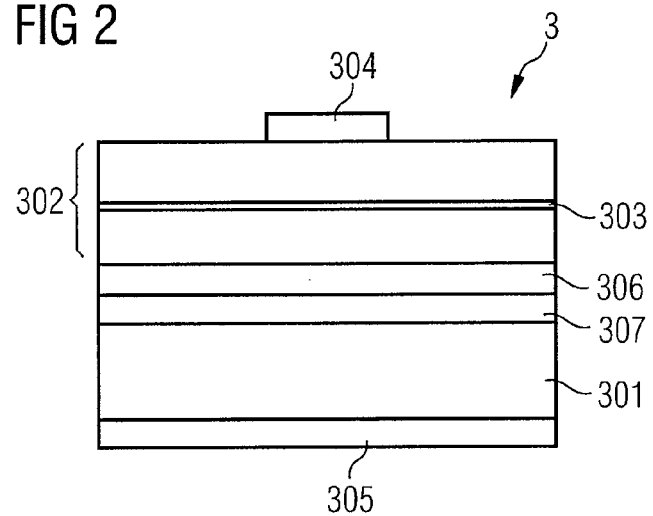
FIG. 2 shows a schematic sectional view of a semiconductor chip that is particularly suitable for an illumination device.

FIG. 2 illustrates an exemplary embodiment of a semiconductor chip that is particularly suitable for an illumination device, on the basis of a schematic sectional view.

The semiconductor chip 3, for instance an LED chip, has a semiconductor body 302 arranged on a carrier 301, said semiconductor body comprising a semiconductor layer sequence with an active zone 303 provided for generating radiation. A first contact 304 is arranged on that side of the semiconductor body which is remote from the carrier, via which contact the semiconductor chip 3 can be electrically connected in conjunction with a second contact 305 arranged on that side of the carrier which is remote from the semiconductor body. The first contact 304 is provided in particular for conductive connection to a bonding wire and the second contact 305 is provided for conductive connection to a connection conductor (in this respect, cf. e.g. the components described in connection with FIGS. 6, 7 and 8). The contacts may contain for example in each case a metal or an alloy.

In one preferred refinement, the semiconductor body 302, in particular the active zone 303, contains at least one III-V semiconductor material, for instance a material from the material systems $In_xGa_yAl_{1-x-y}P$, $In_xGa_yAl_{1-x-y}N$ or $In_xGa_yAl_{1-x-y}As$, in each case with $0 \leq x \leq 1$, $0 \leq y \leq 1$ and $x+y \leq 1$.

III-V semiconductor materials are particularly suitable for generating radiation in the ultraviolet spectral range ($In_xGa_yAl_{1-x-y}N$) through the visible spectral range ($In_xGa_yAl_{1-x-y}N$, in particular for blue to green radiation, or $In_xGa_yAl_{1-x-y}P$, in particular for yellow to red radiation) to the infrared ($In_xGa_yAl_{1-x-y}As$) spectral range. With III-V semiconductor materials, in particular from the material systems mentioned, high internal quantum efficiencies can furthermore advantageously be obtained during the generation of radiation.

In a further preferred refinement, the active zone 303 comprises a heterostructure, in particular a double heterostructure. Furthermore, the active zone may comprise a single or multiple quantum well structure. Particularly high internal quantum efficiencies can be obtained by means of such structures, in particular a multiple quantum well structure or a double hetero structure.

In the context of the application, the designation quantum well structure encompasses any structure in which charge carriers experience a quantization of their energy states by means of confinement. In particular, the designation quantum well structure does not comprise any indication about the dimensionality of the quantization. It thus encompasses, inter alia, quantum wells, quantum wires and quantum dots and every combination of these structures.

In a further preferred refinement, a mirror layer 306 is arranged between the semiconductor body 302 and the carrier 301. The mirror layer may be embodied for example as a metal-containing, in particular essentially metallic, mirror layer. Radiation generated in the active zone can be reflected at the mirror layer, thereby preventing absorption in the structures, for instance the carrier, arranged downstream of the mirror layer as viewed from the active zone. The efficiency of the semiconductor chip 3 can thus be increased. By way of example, the mirror layer contains Au, Al, Ag, Pt, Ti or an alloy with at least one of these materials. Al and Ag have particularly high reflectivities in the ultraviolet and blue spectral ranges, and Au has a particularly high reflectivity also in the yellow, orange and red to infrared spectral ranges. Furthermore, the proportion of radiation emerging at the side of the semiconductor body 302 opposite to the mirror layer 306 is increased as a result of reflection at the mirror layer.

In a further preferred refinement, a connecting layer 307 is arranged between the carrier 301 and the mirror layer 306, by means of which connecting layer the semiconductor body is fixed on the carrier on the part of the mirror layer. The connecting layer 307 may be embodied for example as a solder layer.

The semiconductor chip 3 shown in FIG. 2 is embodied as a thin-film semiconductor chip, which means that during the production of the semiconductor chip, the growth substrate on which the semiconductor layer sequence for the semiconductor chip was grown, for example by means of epitaxy, is stripped away. Accordingly, the carrier 301 is in particular different from the growth substrate and does not have to satisfy the high requirements made for a growth substrate, but rather may be chosen comparatively freely with regard to further properties that are advantageous for the semiconductor chip, for instance a high thermal conductivity.

The carrier preferably has a comparatively high thermal conductivity. By way of example, the carrier contains Ge. A GaAs carrier may also be employed.

The active zone 303 is preferably electrically conductively connected to the second contact 305 via the electrically conductive carrier, the electrically conductive connecting layer and the electrically conductive mirror layer and also the semiconductor layer sequence.

If the carrier contains a semiconductor material, then the carrier is preferably doped in a suitable manner for increasing the conductivity.

In order to produce a thin-film semiconductor chip, by way of example, firstly the semiconductor layer sequence for the semiconductor body 302 is produced on the growth substrate. Afterwards, the mirror layer is applied, for instance by means of vapour deposition, in particular sputtering, onto that side of the semiconductor layer sequence which is remote from the growth substrate. On the part of the mirror layer, the composite comprising semiconductor layer sequence and growth substrate is thereupon connected to the carrier 301 by means of the connecting layer 307, whereupon the growth substrate is removed or stripped away, for instance by means of etching or laser separation.

Thin-film semiconductor chips are distinguished, in particular with a mirror layer, by an advantageously high efficiency. Furthermore, a thin-film semiconductor chip may have a cosinusoidal emission characteristic essentially corresponding to the one of a Lambertian radiator. A semiconductor chip embodied as a surface radiator may be realized in simplified fashion by means of a thin-film semiconductor chip, in particular with a metal-containing mirror layer.

A thin-film semiconductor chip, for instance a thin-film light-emitting diode chip, may furthermore be distinguished by the following characteristic features:

- at a first main area of a semiconductor layer sequence which comprises an active zone, said first main area facing towards a carrier element, e.g. the carrier 301, a mirror layer is applied or formed, for instance integrated as a Bragg mirror in the semiconductor layer sequence, and reflects at least part of the radiation generated in the semiconductor layer sequence back into the latter;
- the semiconductor layer sequence has a thickness in the region of 20 µm or less, in particular in the region of 10 µm, and;
- the semiconductor layer sequence contains at least one semiconductor layer with at least one area having a disordered structure that ideally leads to an approximately ergodic distribution of the light in the semiconductor layer sequence, that is to say it has an as far as possible ergodically stochastic scattering behaviour.

A basic principle of a thin-film light-emitting diode chip is described for example in I. Schnitzer et al., Appl. Phys. Lett. 63 (16), 18 Oct. 1993, 2174-2176, the disclosure content of which is in this respect hereby incorporated by reference in the present application.

It should be noted that the illumination device can, of course, be realized not just with a thin-film semiconductor chip. Some other semiconductor chip, such as, for instance, a semiconductor chip in the case of which the growth substrate is not stripped away, may also be suitable for an illumination device. However, a thin-film semiconductor chip is particularly suitable on account of the high efficiency and a surface emission which can be obtained in a simplified manner and is, preferably increasingly, directed directly in the direction of the optical element.

Figure 3:
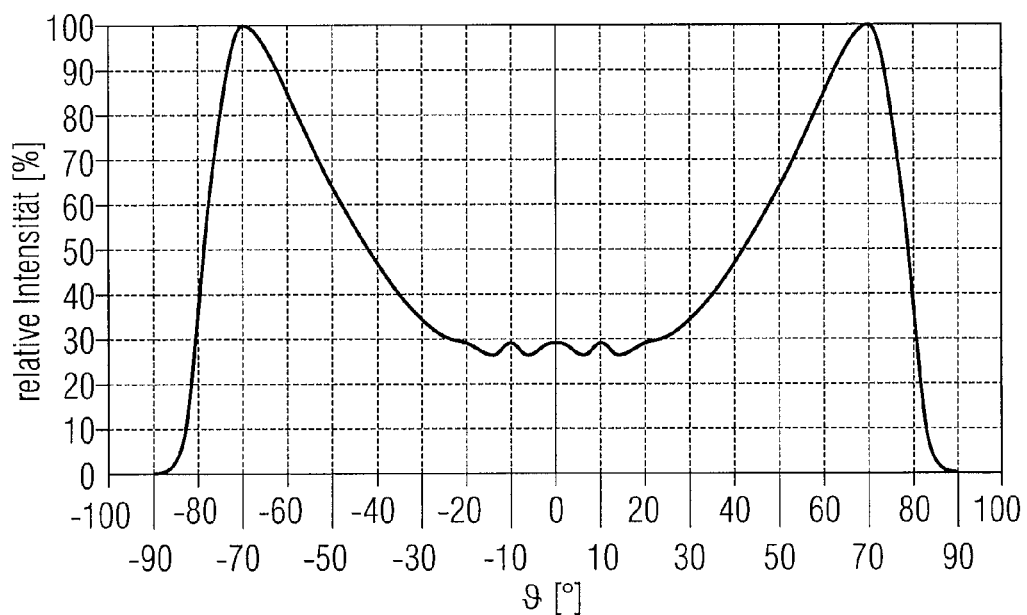
FIG. 3 shows an example of an emission characteristic of an illumination device according to the invention.

FIG. 3 shows an example of an emission characteristic of an illumination device according to the invention. The relative intensity in percent is plotted as a function of the angle θ in ° with respect to the optical axis.

The emission characteristic shown here was determined for an optical element 2 in accordance with FIG. 1 which is embodied in rotationally symmetrical fashion with respect to the optical axis, and a semiconductor chip 3 in accordance with FIG. 2 which was arranged at a distance of 0.6 mm from the radiation entrance area 8.

The illumination device preferably emits a large part of the radiation power laterally with respect to the optical axis, in particular at comparatively large angles. The radiation power coupled out in the concavely curved partial region surrounding the optical axis preferably has a local minimum of the characteristic, in particular in the angular range of between 0° and 10°.

Furthermore, the illumination device preferably emits more than 50%, particularly preferably more than 60°, of the radiation power generated by the semiconductor chip in an angular range of between 80° and 40° with respect to the optical axis.

The maximum of the intensity is at approximately 70°. Proceeding from the concave partial region 5, which corresponds to the region around 0°, the intensity increases as the angle increases, which corresponds to the convexly curved partial region, for instance in accordance with a power function, in particular in accordance with a parabola, and falls sharply after reaching the maximum.

Figure 4C:
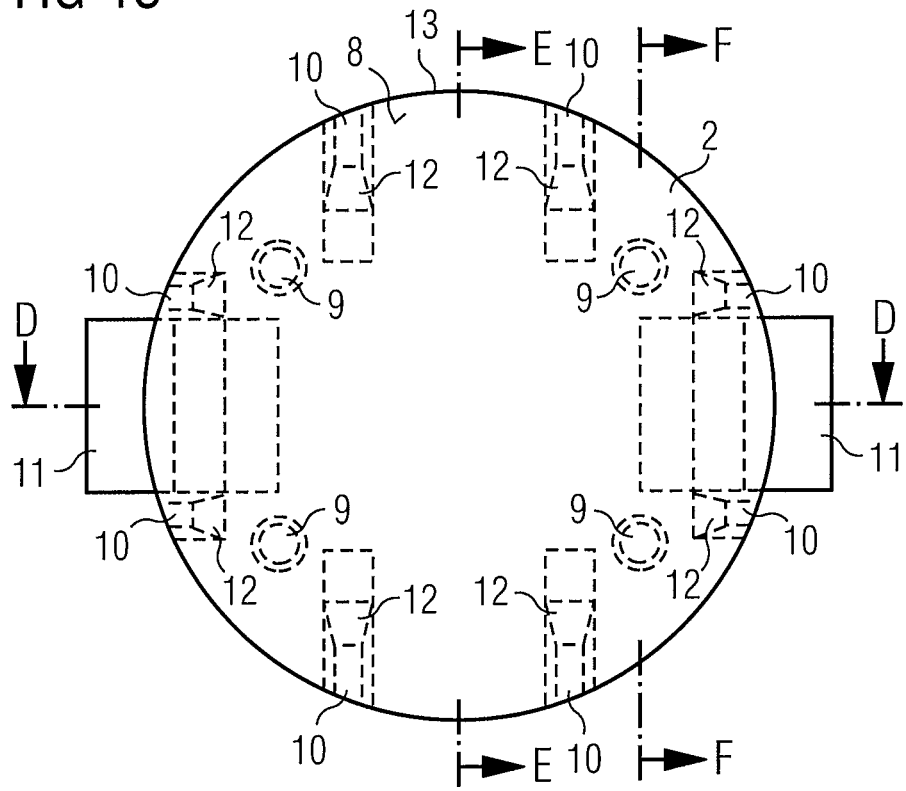
FIG. 4 shows, in FIGS. 4A to 4F, different schematic views of an optical element that is particularly suitable for an illumination device according to the invention.
Figure 4D:
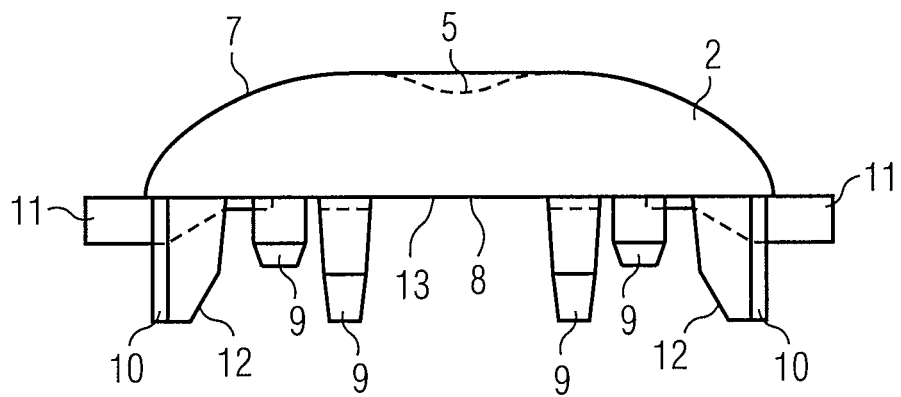
Figure 4E:
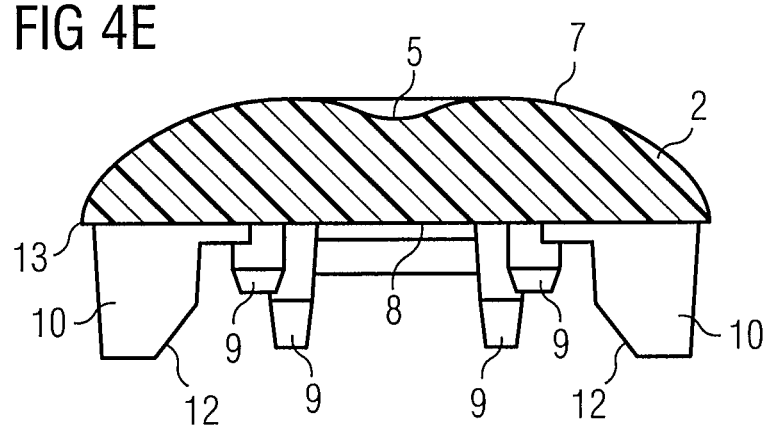
Figure 4F:
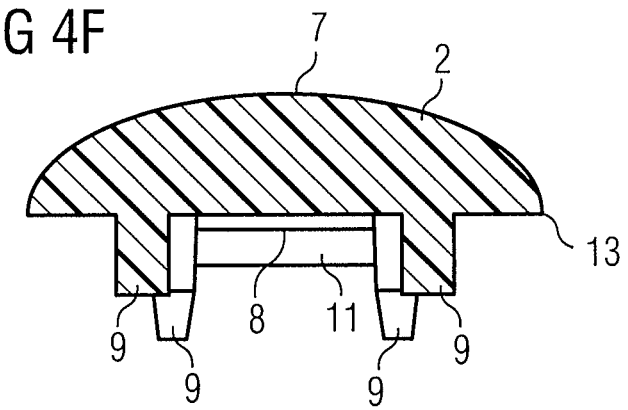

FIG. 4 shows, in FIGS. 4A to 4F, different schematic views of an optical element 2 that is particularly suitable for an illumination device according to the invention. In this case, FIG. 4A shows an oblique view from below of the radiation entrance area 8 of the optical element, FIG. 4B shows an oblique view from above of the radiation exit area 4 of the optical element, FIG. 4C shows a plan view of the radiation entrance area, FIG. 4D shows a side view, FIG. 4E shows a sectional view along the line E-E from FIG. 4C, and FIG. 4F shows a sectional view along the line F-F in FIG. 4C.

The optical element essentially corresponds to the optical element shown in FIG. 1. In contrast to the optical element in accordance with FIG. 1, in the case of which essentially the optical functional regions of the optical element 2 are shown, the optical element 2 in accordance with the exemplary embodiment shown in FIG. 4 has a plurality of fixing elements 9 and guide elements 10. Furthermore, the optical element has at least one orientation element 11, preferably a plurality of orientation elements.

Figure 6:
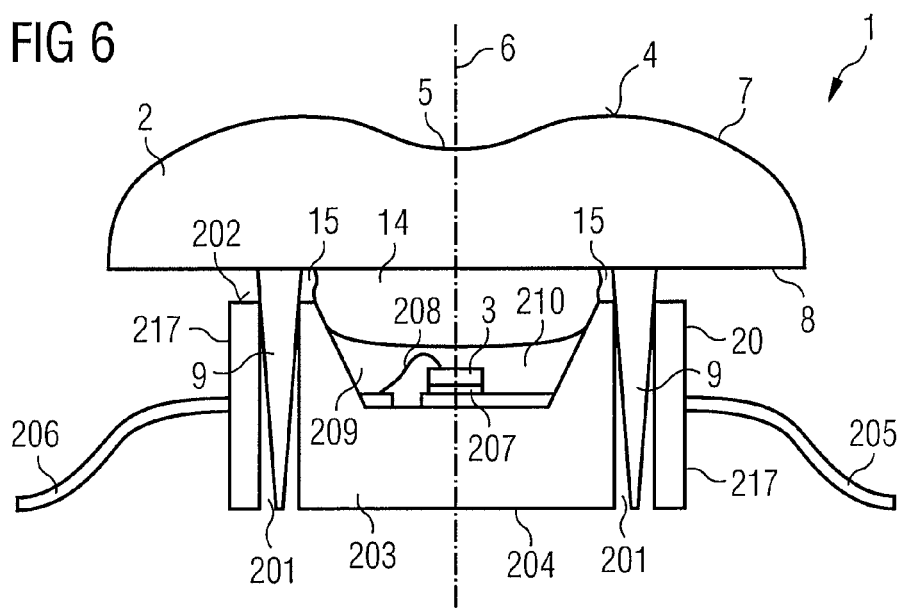
FIG. 6 shows a schematic sectional view of a second exemplary embodiment of an illumination device.

The optical element 2 is formed in particular for fixing at a separate optoelectronic component having a housing body and the semiconductor chip of the illumination device (in this respect, cf. FIGS. 6, 7 and 8).

The optical element 2 is embodied in radiation-transmissive fashion and contains for example a radiation-transmissive silicone or a silicone resin.

The optical element may, if appropriate, also contain a reaction resin, for instance an acrylic or epoxy resin, and/or be embodied in silicone-free fashion. If appropriate, the optical element may contain a thermoplastic material or consist of a thermoplastic material.

The optical element is preferably produced by means of injection moulding, transfer moulding or compression moulding. The fixing elements 9, the guide elements 10 and/or the orientation elements 11 may also be produced by means of these methods. In particular, the elements mentioned and the optical element may be formed in one piece. The optical element is preferably free of undercuts. It is thus possible to dispense with the use of a cost-intensive slide in the mould. In order to facilitate the mould release of the optical element from the mould, the fixing elements 9, the guide elements 10 and/or the orientation elements 11 may be embodied in bevelled fashion and thus may have so-called mould release bevels.

The fixing elements 9, the guide elements 10 and/or the orientation elements 11 are preferably arranged on the part of the radiation entrance area 8 of the optical element.

The guide elements 10 are expediently formed in such a way that during the fixing of the optical element 2 at the optoelectronic component, the fixing elements, in the case of a slightly misaligned arrangement of the fixing elements relative to the corresponding fixing devices of the optoelectronic component, slip or are introduced into the corresponding fixing devices of the optoelectronic component or the fixing elements are guided to the fixing devices. For this purpose, the guide elements 10 are embodied in bevelled fashion on their side remote from the radiation entrance area. The guide elements have a chamfer 12 for this purpose. The guide elements 10 taper in the bevelled region preferably with increasing distance from the radiation entrance area 8. The guide elements 10 are preferably bevelled on one side, in particular on a side remote from an edge 13 that delimits the optical element 2 on the part of the radiation entrance area.

The fixing elements 9 are embodied as individual pins in the exemplary embodiment in accordance with FIG. 4. By way of example, the fixing elements are embodied for press fit and taper, preferably continuously, with increasing distance from the radiation entrance area 8. A diameter of the fixing elements 9 may accordingly decrease with increasing distance from the radiation entrance area 8.

On the part of the radiation entrance area 8, the optical element 2 is delimited by the edge 13. The guide elements 10 are arranged closer to the edge 13 compared with the fixing elements 9. The fixing of the optical element at the optoelectronic component is thus advantageously facilitated and the overall stability of an illumination device with the optoelectronic component and the optical element fixed at the latter is increased.

A fixing element is preferably assigned a plurality of guide elements, for instance two guide elements, as a result of which the fixing of the optical element at the optoelectronic component is advantageously facilitated more extensively on account of improved guidance during the mounting of the optical element. The guide elements assigned to a fixing element are arranged adjacent, preferably directly adjacent, to the fixing element.

The orientation elements 11 advantageously facilitate the mounting of the optical element at the optoelectronic component, in particular the oriented plugging of the optical element onto the component. In a mounting tool into which the optical element can be inserted for fixing at the component, orientation devices corresponding to the orientation elements may be provided, into which orientation devices the orientation elements engage, in particular for the mechanically stable, releasable fixing of the optical element in the tool. It is thus possible to ensure that the optical element is oriented in a predefined manner for mounting in the mounting tool of a placement apparatus. The orientation elements preferably project beyond the edge 13, as a result of which, in particular, points of engagement are formed for the tool and the mounting is simplified.

Furthermore, the optical element, in a plan view of the radiation entrance area 8, is preferably formed in essentially circular fashion. Furthermore, the optical element, in a plan view of the radiation entrance area 8, is preferably formed axially symmetrically with respect to the axes of symmetry E-E and/or D-D from FIG. 4C and/or centrosymmetrically with respect to a centre point of the radiation entrance area.

Figure 5:
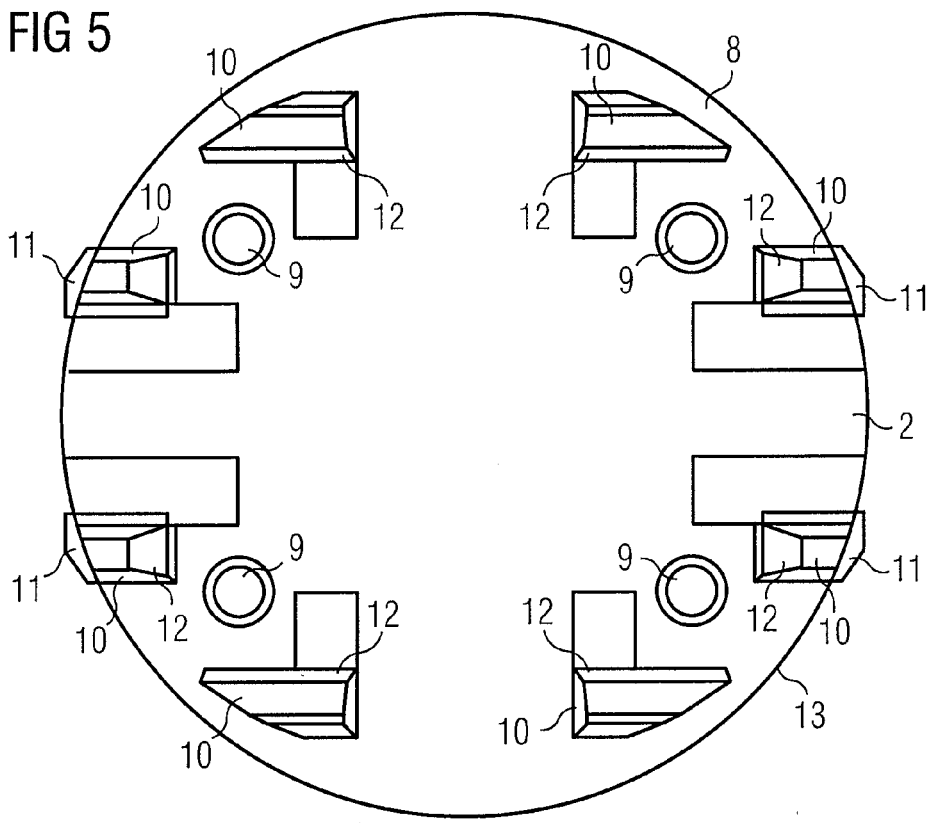
FIG. 5 shows a schematic plan view of a further optical element that is particularly suitable for an illumination device according to the invention.

FIG. 5 shows a further exemplary embodiment of an optical element 2 for an illumination device according to the invention, on the basis of a schematic plan view of the radiation entrance area 8 of this optical element.

The optical element 2 shown in FIG. 5 essentially corresponds to that shown in FIG. 4. In contrast to FIG. 4, separate orientation elements are dispensed with in the optical element in accordance with FIG. 5. Rather, the guide elements 10 are in part also formed as orientation elements 11. The formation of separate orientation elements 11 can thus advantageously be dispensed with. The guide elements 11 formed as orientation elements preferably project beyond the edge 13.

FIG. 6 illustrates a schematic sectional view of a second exemplary embodiment of an illumination device with an optical element fixed at an optoelectronic component.

The illumination device 1 has an optoelectronic component 20 comprising the semiconductor chip 3. The optical element 2, which is formed for example in accordance with one of the previous figures, is fixed at the optoelectronic component 20 by means of the fixing elements 9.

For the fixing of the optical element, fixing devices 201 are formed in the optoelectronic component 1, the fixing elements 9 engaging into said fixing devices in the course of fixing. The fixing devices 201 are preferably formed as cutouts extending from a first main area 202 of a housing body 203 of the optoelectronic component as far as to a second main area 204 opposite to the first main area 202 of the housing body. The cutouts penetrate through the housing body in particular completely. The fixing devices may for example be performed in the housing body as early as during the production thereof. By way of example, the fixing device is embodied in cylindrical fashion. The fixing devices may, if appropriate, also be formed as recesses that do not completely penetrate through the housing body.

The fixing elements 9 are embodied for fixing by means of a press fit. For this purpose, the fixing elements 9 preferably taper with increasing distance from the radiation entrance area 8 of the optical element 2. The optical element 2 is plugged onto the optoelectronic component, the fixing elements 9 engaging into the fixing devices 201. When the fixing elements come into contact with the housing body, a pressure is exerted on the fixing element, said pressure increasing as the optical element is pressed further into the fixing device in such a way that the optical element is finally fixed in a mechanically stable manner at the housing body 203 by means of a press fit.

The radiation entrance area 8 of the optical element 2 fixed at the optoelectronic component 20 is preferably spaced apart from the optoelectronic component, particularly preferably from the housing body, in particular from the first main area 202 thereof. For this purpose, the fixing elements 9 have, expediently in a region adjacent to the radiation entrance area 8, a larger lateral extent compared with the lateral extent of the fixing devices, in particular in a direction parallel to the first main area.

The distance between the semiconductor chip and the optical element, in particular the radiation entrance area 8 thereof, may be 1 mm or less. A distance of 0.6 mm has proved to be particularly advantageous.

It should be noted that not only a press fit is suitable for fixing the optical element at the optoelectronic component. The methods cited further above, hot pressing, caulking, hot caulking, thermal riveting or adhesive bonding, may also be employed, if appropriate with suitable modification of the fixing elements and/or of the fixing devices.

For thermal riveting, by way of example, after introduction into the fixing device on the part of the second main area 204 of the housing body 203, the fixing element projects beyond the second main area. In the protruding segment of the fixing element 9, the fixing element is subsequently heated in such a way that it becomes flowable at least in this partial region. The flowable segment shapes itself (flows) onto the fixing device and/or the housing body, so that a mechanically stable fixing of the optical element 2 at the optoelectronic component 20 is formed after the fixing element has cooled down and solidified. If appropriate, the housing body may also be heated in the region adjoining the fixing elements on the part of the second main area, so that the housing body and the flowable fixing element melt together.

For thermal riveting on the part of the second main area, the lateral extent of the fixing device 201 is preferably greater than that of the fixing element 9 and particularly preferably decreases in the direction of the first main area 202. That volume of the fixing device which is free after the introduction of the fixing element into the fixing device and is not filled by the fixing element is intended for receiving the material projecting beyond the second main area prior to the heating of the fixing element. For this purpose, the fixing device is preferably formed, in the region adjoining the second main area of the housing body, with an approximately trapezoidal cross section tapering in the direction of the first main area. After the tapering, the fixing device may extend in essentially cylindrical fashion in the direction of the first main area.

The optical element 2 may furthermore project laterally beyond side areas 217 of the housing body. In the projecting region, guide elements and/or orientation elements may be arranged at the radiation entrance area 8, which is not accorded an optical function in this region (cf. the explanations in connection with the optical element shown in FIG. 4).

The optoelectronic component 20 has a first electrical connecting conductor 205 and a second electrical connecting conductor 206. These preferably project from the housing body at different side areas thereof. The connecting conductors serve for making electrical contact with the semiconductor chip 3. The semiconductor chip 3 can be electrically conductively connected to the first connecting conductor 205 and/or be fixed thereon by means of a connection layer 207, for instance an electrically conductive adhesive layer or a solder layer. The semiconductor chip is preferably conductively connected to the second connecting conductor 206 by means of a bonding wire 208.

The optoelectronic component 20, in particular the housing body, can be produced by means of moulding encapsulation, for instance by means of an injection moulding, transfer moulding or compression moulding method, of a leadframe comprising the two connecting conductors 205 and 206 with a suitable moulding composition, for instance a plastic material, in particular an epoxide- or acrylic-based material, for instance a reaction resin. The semiconductor chip 3 can subsequently be connected to the connecting conductors. The optoelectronic component can accordingly have a premoulded housing, in particular a so-called premoulded package.

The housing body 203 preferably has a cavity 209, in which the semiconductor chip 3 is arranged. Furthermore, an encapsulation composition 210 may be arranged in the cavity 209, the semiconductor chip 3 being embedded in said encapsulation composition. This encapsulation advantageously protects the semiconductor chip 3 and the bonding wire 208 from harmful external influences. By way of example, the encapsulation contains a reaction resin, for instance an acrylic or epoxy resin, a silicone resin or a silicone. The encapsulation is preferably rigid in order to increase the protection.

The optoelectronic component may furthermore be formed for generating mixed-colour, in particular white, light. For this purpose, part of the radiation generated by the semiconductor chip excites for example a luminescence conversion material (arranged in the encapsulation composition 210), for instance a phosphor, in particular in particle form, to emit longer-wave radiation. Mixed-colour, in particular white, light can consequently arise from the mixing of the radiation generated by the semiconductor chip and the radiation reemitted by the luminescence conversion material. A primary radiation generated by the semiconductor chip in the blue spectral range and a radiation reemitted by the luminescence conversion material in the yellow spectral range are particularly suitable for generating white light.

The housing body 203 is preferably produced from a readily reflective material, for instance white plastic. The walls of the cavity may be coated with a reflection-increasing material, for instance a metal, in order to further increase the reflection of a radiation generated by the semiconductor chip at the wall of the cavity. By means of reflection at the wall of the cavity, the proportion of the radiation fed to the optical element 2 for beam shaping can advantageously be increased compared with a housing body without a cavity 209.

The optoelectronic component is furthermore preferably formed in surface-mountable fashion (SMD: Surface Mountable Device). During the surface mounting, by way of example, the connecting conductors 205 and 206 are soldered onto conductor tracks of a printed circuit board (not illustrated) on the part of soldering areas 211 and 212 of the connecting conductors.

If the optical element 2 is fixed at the optoelectronic component prior to the mounting of the latter, then the entire illumination device 1 with the optoelectronic component 20 and the optical element 2 fixed at the latter is embodied in surface-mountable fashion.

An intermediate layer 14 is arranged between the optical element 2 and the semiconductor chip 3. The intermediate layer may adjoin the encapsulation 210 and, on the radiation entrance side, the optical element. The intermediate layer 14 may furthermore be embodied in plastically shapeable fashion.

The material of the intermediate layer is preferably embodied in adhesion-promoting fashion, thus increasing the mechanical linking of the optical element to the optoelectronic component.

Furthermore, the intermediate layer is preferably embodied as a refractive index adaptation layer, which reduces the jumps in refractive index experienced by radiation generated by the semiconductor chip 3 prior to coupling into the optical element in comparison with an absent intermediate layer. By way of example, the optical element, the intermediate layer and the encapsulation composition may be coordinated with one another in such a way that the refractive indices of materials adjoining one another, such as the refractive index of the encapsulation with respect to that of the intermediate layer or that of the intermediate layer with respect to that of the optical element, are in a ratio of 1.4:1.6 or less, for instance 1.4:1.48, with respect to one another. Reflection losses at interfaces are thus reduced.

The encapsulation, the intermediate layer and the optical element preferably contain a silicone. A refractive index adaptation can thus be effected in a simplified manner.

The encapsulation and the optical element are preferably rigid compared with the intermediate layer, that is to say are embodied such that they can be plastically formed only with a considerably higher expenditure of force.

An intermediate layer containing a silicone gel, for instance SilGel 612 from the company Wacker Chemie, in particular with a mixing ratio of the two components of approximately 1:1 (in this respect, cf. the corresponding data sheet) is particularly suitable. A silicone gel, in particular SilGel 612, may simultaneously have an adhesion-promoting effect, be plastically shapeable and reduce jumps in refractive index. This holds true particularly if the encapsulation and/or the optical element contain a silicone.

The intermediate layer preferably completely covers the encapsulation 210 and the region of the radiation entrance area 8 that is utilized optically for coupling in radiation, so that reflection losses at interfaces are advantageously kept low.

In the event of heating, the intermediate layer can expand into an interspace 15 formed between the optical element and the first main area 202 of the housing body 203, as a result of which the mechanical loading on the illumination device 1, in particular the encapsulation 210 and the optical element, during temperature fluctuations is advantageously kept low.

Figure 7A:
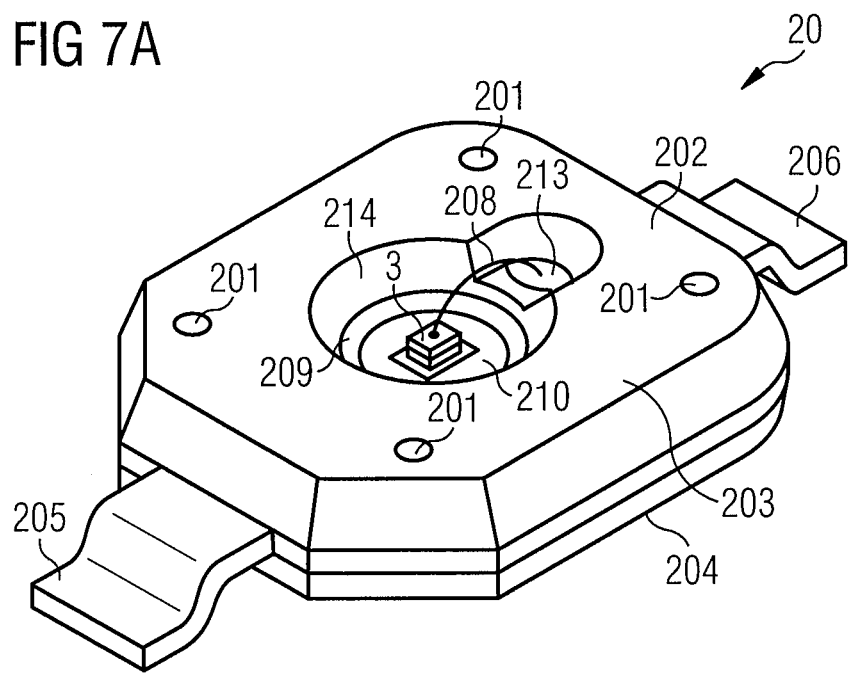
FIG. 7 shows, in FIGS. 7A and 7B, different schematic views of an optoelectronic component that is particularly suitable for an illumination device.
Figure 7B:
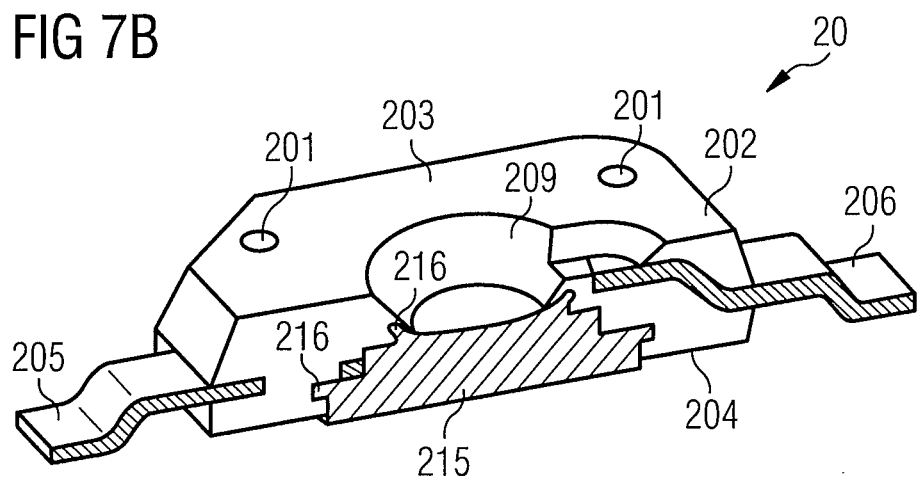

FIG. 7 illustrates an optoelectronic component that is particularly suitable for an illumination device on the basis of a schematic perspective plan view of the optoelectronic component in FIG. 7A and a schematic perspective sectional view of the component in FIG. 7B.

An optoelectronic component of this type is described in more detail in WO 02/084749, for example, the disclosure content of which is hereby explicitly incorporated by reference in the present application. A component similar to that bearing the type designation LW W5SG (manufacturer: Osram Opto Semiconductors GmbH), a related component or a similar component from the same manufacturer is particularly suitable as the optoelectronic component.

The optoelectronic component 20 comprises a first electrical connecting conductor 205 and a second electrical connecting conductor 206, which may project from different side areas of the housing body 203 of the optoelectronic component 20 and are formed for example wing-like.

The housing body 203 has a cavity 209, in which is arranged the semiconductor chip 3 embedded in an encapsulation 210. The semiconductor chip 3 is electrically conductively connected to the connecting conductor 205 for example by means of a soldering connection. A conductive connection to the second connecting conductor 206 is produced by means of the bonding wire 208. The bonding wire is connected to the second connecting conductor 206 preferably in the region of a bulge 213 in a wall 214 of the cavity 209.

The semiconductor chip 3 is arranged on a thermal connection part 215, which functions as a chip carrier. The thermal connection part extends in the vertical direction preferably from the cavity as far as the second main area 204 of the housing body 203 and facilitates a large-area—in particular relative to the chip mounting area on the thermal connection part—thermal connection of the semiconductor chip 3 on the part of the second main area to an external heat conducting device, for instance a heat sink e.g. made of Cu. The thermal loading on the housing body can thus advantageously be reduced, particularly when the component is operated as a high-power component with a high-power semiconductor chip, for instance a thin-film semiconductor chip (cf. the semiconductor chip described in connection with FIG. 2). The optoelectronic component may be formed for generating a high radiation power in conjunction with a heat dissipation that is advantageously improved at the same time on account of the thermal connection part. Such an optoelectronic component is particularly suitable for illuminating areas, for instance for the backlighting of a display device, for instance an LCD.

The thermal connection part is for example linked into a lug of the first connecting conductor 205 or connected in some other way to the first connecting conductor, in particular electrically conductively and/or mechanically, laterally peripherally connected. The second connecting conductor 206, which is provided for making contact with the bonding wire 208, is preferably elevated with regard to the chipmounting plane of the semiconductor chip 3 on the thermal connection part 215. The area of the wall of the cavity that is available for reflection of radiation is thus advantageously kept large. Furthermore, the thermal connection part itself may be embodied in reflective fashion and then preferably forms part of the bottom and/or the wall of the cavity. The thermal connection part may furthermore project from the housing body on the part of the second main area or terminate essentially in planar fashion with the housing body. By way of example, the thermal connection part contains a metal having a high thermal conductivity, for instance Cu or Al, or an alloy, for instance a CuW alloy.

A leadframe having the two connecting conductors 205 and 206 and the thermal connection part 215 can be surrounded with the material of the housing body during the production of such an optoelectronic component using a suitable moulding method, for instance an injection moulding method. The semiconductor chip is arranged at or in the premoulded housing after the production of the housing body. The thermal connection part 215 is preferably formed with one or a plurality of bulges or protrusions 216, thereby improving the mechanical linking of the thermal connection part to the housing body and thus increasing the overall stability of the optoelectronic component.

Fixing devices 201 provided for fixing the optical element are formed on the part of the first main area 202 of the housing body, it being possible for the optical element to be embodied for example in accordance with the exemplary embodiments described further above. For fixing the optical element at the housing body 203, four fixing devices 201 may be provided, for example, which facilitate a mechanically stable fixing of the optical element at the component. The fixing devices 201 are expediently arranged in the corner regions of the first main area 202 of the housing body 203.

FIG. 8 shows, in FIGS. 8A to 8D, different schematic views of an optoelectronic component and of an exemplary embodiment of an illumination device according to the invention. FIG. 8A shows a side view of the optoelectronic component, FIG. 8B shows a plan view of the optoelectronic component 20, FIG. 8C shows an oblique plan view of the optoelectronic component from above, and FIG. 8D shows a side view of the illumination device 1 with the optical element 2 fixed at the optoelectronic component. The optoelectronic component 20 shown in FIG. 8 is embodied for example in accordance with the component described in connection with FIG. 7.

In contrast thereto in accordance with FIG. 8, a material for the intermediate layer 14, for instance in drop or hemispherical form, is arranged on the encapsulation composition 210 arranged in the cavity 209, said encapsulation composition preferably containing a rigid material that protects the semiconductor chip and the bonding wire 208. The diameter B of the material for the intermediate layer is preferably less than the diameter A of the cavity 209. The material of the intermediate layer 14 is in this case preferably formed in plastically shapeable fashion. By way of example, the material contains a silicone gel, for instance of the type mentioned further above. The material of the intermediate layer may be applied in the liquid phase to the optoelectronic component and in particular the encapsulation composition 210, for instance dropwise. It is preferably subsequently converted into a solid, but still plastically shapeable phase. For this purpose, the optoelectronic component may be heated, for example to a temperature of 140 degrees, and the applied material of the intermediate layer crosslinks directly after application in a temperature-induced manner at least partly in such a way that it is dimensionally stable and shapeable.

The material for the intermediate layer 14 preferably projects above the first main area 202 of the housing body 203. If the optical element 2, for instance the one illustrated in FIG. 4, is plugged onto the optoelectronic component 20 from the side of the first main area 202 and subsequently pressed on more extensively, then the radiation entrance area 8 can come into contact with the material of the intermediate layer 14. The pressure exerted distributes the material laterally, in particular in a direction parallel to the first main area of the housing body. The intermediate layer 14 is thereby formed, which is in direct mechanical contact with the encapsulation 210 and the optical element. The cavity 209 is preferably completely covered by the intermediate layer in the lateral direction. The optical linking of the semiconductor chip to the optical element is improved by such a large lateral extent of the intermediate layer 14.

The guide elements 10 are arranged laterally beside the side areas 217 of the housing body. The guide elements preferably adjoin the housing body in frictionally locking fashion. This increases the mechanical stability of the optical element fixed at the optoelectronic component and the overall stability of the illumination device 1.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or the exemplary embodiments.

What is claimed is:

1. An illumination device comprising:
an optoelectronic component having a housing body and at least one semiconductor chip provided for generating radiation, and a separate optical element, which is fixed at the optoelectronic component, said optical element, wherein an intermediate layer is arranged between a radiation entrance area of the optical element and the optoelectronic component.

2. The illumination device according to claim 1, wherein an interspace is formed between the optical element and the optoelectronic component.

3. The illumination device according to claim 2, wherein the interspace is provided as a gap for receiving the intermediate layer in the event of an expansion of the intermediate layer.

4. The illumination device according to claim 1, wherein the intermediate layer is plastically shapeable.

5. The illumination device according to claim 1, wherein the intermediate layer contains a silicone.

6. The illumination device according to claim 5, wherein the intermediate layer contains a silicone gel.

7. The illumination device according to claim 1, wherein the semiconductor chip is embedded in an encapsulation and the intermediate layer adjoins the encapsulation and the optical element.

8. The illumination device according to claim 1, wherein the intermediate layer is formed as a refractive index adaption layer.

9. The illumination device according to claim 1, wherein the radiation exit area has a concavely curved partial region and a convexly curved partial region, which at least partly surrounds the concavely curved partial region at a distance from the optical axis, the optical axis running through the concavely curved partial region.

10. An optical element wherein:
the optical element is configured to be fixed at an optoelectronic component for an illumination device;
the optical element has at least one fixing element provided for fixing the optical element at the optoelectronic component; and
the optical element has at least one guide element which, compared with the fixing element, is arranged closer to an edge delimiting the optical element on the part of the fixing element.

11. The optical element according to claim 10, wherein the guide element is embodied in bevelled fashion on a side remote from the edge.

12. The optical element according to claim 10, wherein the optical element has a plurality of fixing elements and guide elements and the number of guide elements is greater than the number of fixing elements.

13. The optical element according to claim 10, wherein the fixing element is arranged on a radiation entrance area of the optical element.

14. A system comprising the optical element of claim 10 and an optoelectronic component which has a fixing device, wherein the optical element can be fixed at the optoelectronic component by means of interaction of the fixing element with the fixing device, and wherein the guide element is configured such that the fixing element is guidable to the fixing device by means of the guide element.

* * * * *

UNITED STATES PATENT AND TRADEMARK OFFICE
CERTIFICATE OF CORRECTION

PATENT NO. : 8,525,206 B2  
APPLICATION NO. : 12/971543  
DATED : September 3, 2013  
INVENTOR(S) : Simon Blümel et al.

Page 1 of 1

It is certified that error appears in the above-identified patent and that said Letters Patent is hereby corrected as shown below:

TITLE PAGE

Related U.S. Application Data, (63), second line, after the word "Pat. No. 7,880,188" insert
-- National Stage of International Application No. PCT/DE2006/000314, filed Feb. 21, 2006 --

Signed and Sealed this
Third Day of December, 2013

Margaret A. Focarino
*Commissioner for Patents of the United States Patent and Trademark Office*